United States Patent [19]

Evoy

[11] Patent Number: 5,642,388
[45] Date of Patent: Jun. 24, 1997

[54] FREQUENCY ADJUSTABLE PLL CLOCK GENERATION FOR A PLL BASED MICROPROCESSOR BASED ON TEMPERATURE AND/OR OPERATING VOLTAGE AND METHOD THEREFOR

[75] Inventor: David R. Evoy, Tempe, Ariz.

[73] Assignee: VLSI Technology, Inc., San Jose, Calif.

[21] Appl. No.: 383,334

[22] Filed: Feb. 3, 1995

[51] Int. Cl.$^6$ .................................................. H03D 3/24
[52] U.S. Cl. .................. 375/376; 331/1 R; 331/177 R; 327/156
[58] Field of Search ........................ 375/327, 376; 331/1 R, 34, 1 A, 177 R; 327/147, 156

[56] References Cited

U.S. PATENT DOCUMENTS 5,493,713  2/1996  Horsfall et al. .................. 375/376
5,497,126  3/1996  Kosiec et al. ..................... 375/376
5,526,362  6/1996  Thompson et al. ................ 375/376

*Primary Examiner*—Stephen Chin
*Assistant Examiner*—Don Vo
*Attorney, Agent, or Firm*—Harry M. Weiss & Assoc.

[57]  ABSTRACT

A PLL based microprocessor whose frequency may be adjusted by using a microprocessor clock control circuit. The microprocessor clock control circuit comprises a circuit for providing a slew rate limited overdampened PLL that continuously seeks a new frequency, a circuit for selecting a current target frequency for the microprocessor, a circuit for comparing the current target frequency to the current frequency setting of the microprocessor, and a circuit for adjusting the current frequency setting of the microprocessor to match the current target frequency.

12 Claims, 1 Drawing Sheet

FREQUENCY ADJUSTABLE PLL CLOCK GENERATION FOR A PLL BASED MICROPROCESSOR BASED ON TEMPERATURE AND/OR OPERATING VOLTAGE AND METHOD THEREFOR

BACKGROUND OF THE INVENTION

1. Field of the Invention

This invention relates generally to phase locked loop (PLL) based microprocessors, and more specifically, to a microprocessor clock control circuit that adjusts the frequency of the PLL based microprocessor and method therefor.

2. Description of the Prior Art

Microprocessors with internal PLL loops present unique problems for power management. In order to change the frequency of these types of processors, the following needs to be done: assert a stop clock and wait for a stop grant cycle, change the frequency of the microprocessor, and wait for the microprocessor's internal PLL to lock onto a new frequency which generally takes one millisecond.

The above procedure for changing the frequency of the microprocessor is not optimal for several reasons. First, during the one millisecond it takes for the microprocessor's internal PLL to lock on to a new frequency, power is consumed and no work is done. Second, interrupt and direct memory access (DMA) latency issues exist such as loss of data, data corruption, or even system failure. Third, the PLL lock time has the effect of causing the power management to be overly cautious in controlling the clock. For example, assume the system is running the microprocessor at a maximum frequency. When it becomes desirable to enter a lower power state, the system must be able to tolerate the 1 millisecond latency. In a worst case situation, the latency is greater than 2 milliseconds assuming there is a 1 millisecond PLL relock time. Assume that the processor is running at a maximum frequency and a decision is made, either by hardware or software, to slow the clock. At the same instance that the slow down process is started, a system condition changes which requires the system to return to the maximum frequency. In this case, the microprocessor would begin the process of changing the speed of the clock. After the clock rate is changed, a 1 millisecond delay is required for the PLL relock time. When the microprocessor resumes operation after the PLL relock time, it would discover that a new demand has been made to alter the frequency. This discovery, from an interrupt, a system management interrupt (SMI), or software poll, would occur at the new slower microprocessor rate. It is also possible that additional data and/or work has accumulated during the 1 millisecond delay which was required for the clock to change. Returning the system to the maximum frequency will take an additional 1 millisecond. The performance impact is therefor 2 milliseconds of dead time and some execution of commands at a slower microprocessor rate.

Therefore a need exist to provide an improved microprocessor or a circuit external to the existing microprocessor that can overcome this requirement. The improved microprocessor or microprocessor clock control circuit must be capable of continually adjusting its frequency based on the current system operating conditions.

SUMMARY OF THE INVENTION

It is an object of the present invention to provide an improved microprocessor clock control circuit and method therefor.

It is another object of the present invention to provide an improved microprocessor clock control circuit and method therefor that is capable of continually adjusting its frequency based on the current system operating conditions.

BRIEF DESCRIPTION OF THE PREFERRED EMBODIMENTS

In accordance with one embodiment of the present invention a method of adjusting the frequency of a microprocessor is disclosed. The method comprises the steps of providing a slew rate limited overdampened phase locked loop (PLL) that continuously seeks a new frequency, selecting a current target frequency for the microprocessor, comparing the current target frequency to a current frequency setting of the microprocessor, and adjusting the current frequency setting of the microprocessor to match the current target frequency.

In accordance with another embodiment of the present invention a microprocessor clock control circuit for adjusting the frequency of a PLL based microprocessor is disclosed. The microprocessor clock control circuit comprises a slew rate limited overdampened PLL that continuously seeks a new frequency, means for selecting a current target frequency for the microprocessor, means for comparing the current target frequency to a current frequency setting of the microprocessor, and means for adjusting the current frequency setting of the microprocessor to match the current target frequency.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENT

Figure 1:
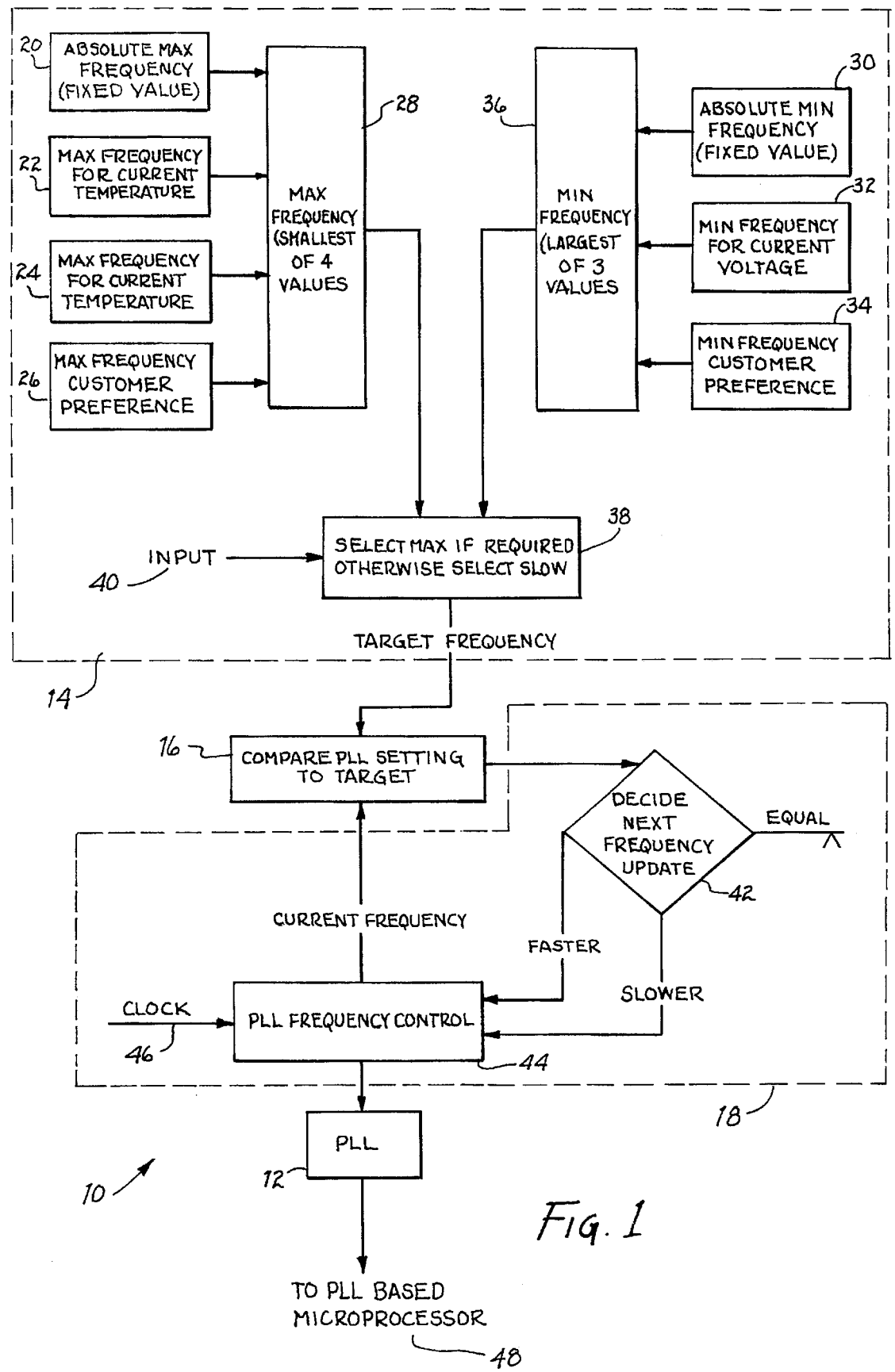
FIG. 1 shows a simplified block diagram of the microprocessor clock control circuit of the present invention.

Referring to FIG. 1, a simplified block diagram of a microprocessor clock control circuit 10 is shown. The microprocessor clock control circuit 10 is comprised of a phase locked loop 12, means for selecting 14 which selects a current target frequency, means for comparing 16 which compares a current frequency setting of the microprocessor clock control circuit 10 to the current target frequency that was selected, and means for adjusting 18 which adjusts the current frequency setting of the microprocessor clock control circuit 10 to match the current target frequency selected.

The means for selecting 14 monitors multiple variables to determine a current target frequency for a PLL based microprocessor 48. The variables monitored include temperature and/or operating voltage of the microprocessor 48. The operating voltage of the microprocessor 48 may be controlled or monitored as part of the present invention.

The means for selecting 14 is comprised of three sections. The first section determines a maximum operating frequency for the microprocessor 48. The first section comprises means for determining the microprocessor's absolute maximum frequency 20, which is a fixed value; means for determining a maximum operating frequency for the microprocessor's current voltage 22; means for determining a maximum operating frequency for the microprocessor's current temperature 24; and means for determining a customer's maximum operating frequency preference 26. Each of the means for determining a maximum operating frequency has an output which is coupled to means for selecting a maximum operating frequency 28. The means for selecting a maximum operating frequency 28 selects a maximum operating frequency which is the lowest frequency between the microprocessor's absolute maximum operating frequency, the maximum operating frequency for the microprocessor's current voltage, the maximum operating frequency for the microprocessor's current temperature, and the customer's maximum operating frequency preference.

The second section of the means for selecting 14 determines a minimum operating frequency for the microprocessor 48. The second section comprises means for determining the microprocessor's absolute minimum operating frequency 30, which is a fixed value; means for determining a minimum operating frequency for the microprocessor's current voltage 32; and means for determining a customer's minimum operating frequency preference 34. Each of the means for determining a minimum operating frequency for the microprocessor 48 has an output which is coupled to means for selecting a minimum operating frequency 36. The means for selecting a minimum operating frequency 36 selects a minimum operating frequency which is the highest frequency between the microprocessor's absolute minimum operating frequency, the minimum operating frequency for the microprocessor's current voltage, and the customer's minimum operating frequency preference.

The third section of the means for selecting 14 comprises means for selecting the maximum operating frequency or the minimum operating frequency 38. The means for selecting the maximum operating frequency or the minimum operating frequency 38 is coupled to an input 40 which selects the maximum operating frequency or the minimum operating frequency. The input 40 is typically controlled by a digital source (not shown) which would select the maximum operating frequency or the minimum operating frequency after taking a variety of different system conditions into account. Once a frequency has been selected, that frequency becomes the current target frequency for the microprocessor 48. Generally speaking, any system activity would cause the maximum operating frequency to be selected as the current target frequency.

The output of the means for selecting the maximum target frequency or the minimum target frequency 38 is coupled to the means for comparing 16. The means for comparing 16 compares the current frequency setting of the microprocessor clock control circuit 10 to the current target frequency selected by the means for selecting the maximum operating frequency or the minimum operating frequency 38.

The output of means for comparing 16 is coupled to means for adjusting 18. Means for adjusting 18 adjusts the current frequency setting of the microprocessor clock control circuit 10 to match the current target frequency selected by the select means 38. The means for adjusting 18 comprises means for deciding a next frequency update 42 and means for adjusting the PLL frequency control 44.

The means for deciding a next frequency update 42 will generally update the frequency periodically at intervals of 1 second or faster. If the output from the means for comparing 16 indicates that the current frequency setting of the microprocessor clock control circuit 10 and the current target frequency are equal, when the means for deciding the next frequency update 42 decides to update the current frequency, the means for adjusting the PLL frequency control 44 will not alter the current frequency setting of the microprocessor clock control circuit 10. If the output from the means for comparing 16 indicates that the current frequency setting of the microprocessor clock control circuit 10 and the current target frequency are not equal, when the means for deciding the next frequency update 42 decides to update the current frequency, the means for adjusting the PLL frequency control 44 will alter the current frequency setting of the microprocessor clock control circuit 10 to match the current target frequency.

The output of the means for adjusting 18 is coupled to the PLL 12. The PLL 12 is coupled to the PLL based microprocessor 48. By changing the microprocessor clock control circuit's frequency, the frequency of the microprocessor 48 will also be changed to match the current target frequency. The microprocessor's current frequency setting must be changed very slowly to allow the microprocessor's internal PLL based clock generator (not shown) to track any changes. It should be noted that the PLL 12 of the microprocessor clock control circuit 10 should be more stable than the microprocessor's internal PLL (not shown) to insure that the PLL of the microprocessor 48 can track the changes. In its preferred embodiment, the internal PLL of the microprocessor 48, as well as the PLL of the microprocessor clock control circuit 10, are both slew rate limited overdampened PLLs.

The means for adjusting the PLL frequency control 44, which is coupled to the PLL 12, allows the microprocessor clock control circuit 10 to adjust the current frequency setting to match current operating conditions. Method matching the frequency and voltage of the microprocessor 48 using a slew rated limited overdampened PLL allows for the maximum frequency to be obtained for the current operating condition. Typically the maximum frequency would be achieved when the system was below the maximum temperature and at the maximum voltage. The present invention allows the system to run at the maximum frequency for voltages and temperatures that are not maximum values, but are typical operating values. Method matching the frequency and voltage of the microprocessor 48 using a slew rate limited overdampened PLL also allows for minimum operating voltages for the current frequency. Typically the operating voltage is set at a fixed value that assures operation at the maximum frequency. When the frequency of the system is reduced, the voltage can also be reduced, resulting in a multiplication of the power savings. The power savings being based on the formula:

$$P=P1-P2$$

where
P is the power savings,
P1 is the power at the current settings, and
P2 is the power at the new settings $$P1=V1^2*f1$$

where
V1 is the current voltage setting, and
f1 is the current frequency setting $$P2=V2^2*f2$$

where
V2 is the new voltage setting, and
f2 is the new frequency setting

In power managed systems, this will result in substantial power savings. When frequency and voltage are both controlled, the voltage may be increased prior to increasing the frequency, and the frequency may be decreased prior to decreasing the voltage. This assures that the system does not run at a frequency that is too fast for the current voltage thus resulting in further power savings.

While the invention has been particularly shown and described with reference to preferred embodiments thereof, it will be understood by those skilled in the art that the foregoing and other changes in form and details may be made therein without departing from the spirit and scope of the invention.

I claim:

1. A method of adjusting a frequency of a phased locked loop (PLL) based microprocessor comprising the steps of:

providing a slew rate limited overdampened PLL that continuously seeks a new frequency;

selecting a current target frequency for said microprocessor;

comparing said current target frequency to a current frequency setting of said slew rate limited overdampened PLL; and adjusting said current frequency setting of said slew rate limited overdampened PLL to match said current target frequency.

2. The method of claim 1 wherein said step of selecting a current target frequency for said microprocessor includes the steps of:

determining a maximum operating frequency for said microprocessor;

determining a minimum operating frequency for said microprocessor;

selecting said maximum operating frequency if current system requirements require said maximum operating frequency; and selecting said minimum operating frequency if said current system requirements do not require said maximum operating frequency.

3. The method of claim 2 wherein said step of determining a maximum operating frequency for said microprocessor includes the steps of:

determining an absolute maximum operating frequency of said microprocessor;

determining a maximum operating frequency for a current voltage of said microprocessor;

determining a maximum operating frequency for a current temperature of said microprocessor;

determining a customer's maximum operating frequency preference; and selecting a lowest frequency between said absolute maximum operating frequency, said maximum operating frequency for a current voltage, said maximum operating frequency for a current temperature, and said customer's maximum operating frequency preference.

4. The method of claim 2 wherein said step of determining a minimum operating frequency for said microprocessor includes the steps of:

determining an absolute minimum operating frequency for said microprocessor;

determining a minimum operating frequency for a current voltage of said microprocessor;

determining a customer's minimum operating frequency preference for said microprocessor; and selecting a highest frequency between said absolute minimum operating frequency, said minimum operating frequency for a current voltage; and said customer's minimum operating frequency preference.

5. The method of claim 1 wherein said step of adjusting said current frequency setting further comprises the steps of:

deciding a next frequency update;

slowly increasing said current frequency setting at said next frequency update if said current frequency setting is less than said current target frequency to allow a clock generator of said PLL based microprocessor to track changes;

slowly decreasing said current frequency setting at said next frequency update if said current frequency setting is greater than said current target frequency to allow said clock generator of said PLL based microprocessor to track changes; and leaving said current frequency setting at its present setting if said current frequency setting is not less than said current target frequency nor greater than said current target frequency.

6. A method of adjusting a frequency of a phased locked loop (PLL) based microprocessor comprising the steps of:

providing a slew rate limited overdampened PLL that continuously seeks a new frequency;

determining an absolute maximum operating frequency of said microprocessor;

determining a maximum frequency for a current voltage of said microprocessor;

determining a maximum frequency for a current temperature of said microprocessor;

determining a customer's maximum frequency preference;

determining a maximum operating frequency of said microprocessor by selecting a lowest frequency between said absolute maximum operating frequency, said maximum frequency for a current voltage, said maximum frequency for a current temperature, and said customer's maximum frequency preference;

determining an absolute minimum operating frequency for said microprocessor;

determining a minimum frequency for a current voltage of said microprocessor;

determining a customer's minimum frequency preference for said microprocessor;

determining a minimum operating frequency for said microprocessor by selecting a highest frequency between said absolute minimum operating frequency, said minimum frequency for a current voltage, and said customer's minimum frequency preference;

selecting said maximum operating frequency if current system requirements require said maximum operating frequency;

selecting said minimum operating frequency if said current system requirements do not require said maximum operating frequency;

deciding a next frequency update;

slowly increasing said current frequency setting if a current frequency setting is less than a current target frequency to allow a clock generator of said PLL based microprocessor to track changes;

slowly decreasing said current frequency setting if said current frequency setting is greater than said current target frequency to allow said clock generator of said PLL based microprocessor to track changes; and leaving said current frequency setting at its present setting if said current frequency setting is not less than said current target frequency nor greater than said current target frequency.

7. A clock control circuit for a phased locked loop (PLL) based microprocessor whose frequency is adjustable comprising, in combination:

a slew rate limited overdampened PLL that continuously seeks a new frequency;

means for selecting a current target frequency for said microprocessor;

means for comparing said current target frequency to a current frequency setting of said slew rate limited overdampened PLL; and means for adjusting said current frequency setting of said slew rate limited overdampened PLL to match said current target frequency.

8. A clock control circuit in accordance with claim 7 wherein said means for selecting a current target frequency further comprises:

means for determining a maximum operating frequency for said microprocessor;

means for determining a minimum operating frequency for said microprocessor;

means for selecting said maximum operating frequency if current system requirements require said maximum operating frequency; and means for selecting said minimum operating frequency if said current system requirements do not require said maximum operating frequency.

9. A clock control circuit in accordance with claim 8 wherein said means for determining a maximum operating frequency for said microprocessor further comprises:

means for determining an absolute maximum operating frequency of said microprocessor;

means for determining a maximum frequency for a current voltage of said microprocessor;

means for determining a maximum frequency for a current temperature of said microprocessor;

means for determining a customer's maximum frequency preference; and means for selecting a lowest frequency between said absolute maximum operating frequency, said maximum frequency for a current voltage, said maximum frequency for a current temperature, and said customer's maximum frequency preference.

10. A clock control circuit in accordance with claim 8 wherein said means for determining a minimum operating frequency for said microprocessor further comprises:

means for determining an absolute minimum operating frequency for said microprocessor;

means for determining a minimum frequency for a current voltage of said microprocessor;

means for determining a customer's minimum frequency preference for said microprocessor; and means for selecting a highest frequency between said absolute minimum operating frequency, said minimum frequency for a current voltage; and said customer's minimum frequency preference.

11. A clock control circuit in accordance with claim 8 wherein said means for adjusting said current frequency setting further comprises:

means for deciding a next frequency update;

means for slowly increasing said current frequency setting at said next frequency update if said current frequency setting is less than said current target frequency to allow a clock generator of said PLL based microprocessor to track changes;

means for slowly decreasing said current frequency setting at said next frequency update if said current frequency setting is greater than said current target frequency to allow said clock generator of said PLL based microprocessor to track changes; and means for leaving said current frequency setting at its present setting if said current frequency setting is not less than said current target frequency nor greater than said current target frequency.

12. A clock control circuit for a phased locked loop (PLL) based microprocessor whose frequency is adjustable comprising, in combination:

a slew rate limited overdampened PLL that continuously seeks a new frequency;

means for determining an absolute maximum operating frequency of said microprocessor;

means for determining a maximum frequency for a current voltage of said microprocessor;

means for determining a maximum frequency for a current temperature of said microprocessor;

means for determining a customer's maximum frequency preference;

means for determining a maximum operating frequency of said microprocessor by selecting a lowest frequency between said absolute maximum operating frequency, said maximum frequency for a current voltage, said maximum frequency for a current temperature, and said customer's maximum frequency preference;

means for determining an absolute minimum operating frequency for said microprocessor;

means for determining a minimum frequency for a current voltage of said microprocessor;

means for determining a customer's minimum frequency preference for said microprocessor;

means for determining a minimum operating frequency for said microprocessor by selecting a highest frequency between said absolute minimum operating frequency, said minimum frequency for a current voltage, and said customer's minimum frequency preference;

means for selecting said maximum operating frequency if current system requirements require said maximum operating frequency;

means for selecting said minimum operating frequency if said current system requirements do not require said maximum operating frequency;

means for deciding a next frequency update;

means for slowly increasing a current frequency setting if said current frequency setting is less than a current target frequency to allow a clock generator of said PLL based microprocessor to track changes;

means for slowly decreasing said current frequency setting if said current frequency setting is greater than said current target frequency to allow said clock generator of said PLL based microprocessor to track changes; and means for leaving said current frequency setting at its present setting if said current frequency setting is not less than said current target frequency nor greater than said current target frequency.

\* \* \* \* \*